(12) United States Patent
Obata et al.

(10) Patent No.: US 10,298,239 B2
(45) Date of Patent: May 21, 2019

(54) OSCILLATOR, ELECTRONIC APPARATUS, AND VEHICLE

(71) Applicant: SEIKO EPSON CORPORATION, Tokyo (JP)

(72) Inventors: Naohisa Obata, Minowa-machi (JP); Takuya Owaki, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 164 days.

(21) Appl. No.: 15/450,370

(22) Filed: Mar. 6, 2017

(65) Prior Publication Data

US 2017/0272082 A1 Sep. 21, 2017

(30) Foreign Application Priority Data

Mar. 18, 2016 (JP) .................. 2016-055871

(51) Int. Cl.
*H03B 5/04* (2006.01)
*H03B 5/32* (2006.01)
*H03H 9/05* (2006.01)
*H03L 1/04* (2006.01)
*H03L 1/02* (2006.01)
*H03B 1/02* (2006.01)

(52) U.S. Cl.
CPC ............... *H03L 1/04* (2013.01); *H03B 1/02* (2013.01); *H03B 5/04* (2013.01); *H03B 5/32* (2013.01); *H03H 9/0547* (2013.01); *H03L 1/026* (2013.01); *H03L 1/028* (2013.01); *H01L 2224/48091* (2013.01); *H01L 2924/16195* (2013.01); *H03B 2201/038* (2013.01)

(58) Field of Classification Search
CPC ... H03B 5/04; H03B 5/30; H03B 5/32; H03B 2201/038; H03H 9/0547; H03L 1/00; H03L 1/02; H03L 1/026; H03L 1/028; H03L 1/04
USPC ...................... 331/68–70, 154, 156, 158, 176
See application file for complete search history.

(56) References Cited

U.S. PATENT DOCUMENTS

| | | | | |
|---|---|---|---|---|
| 6,229,249 B1 * | 5/2001 | Hatanaka | ................ | H03B 5/04 310/348 |
| 6,653,906 B1 * | 11/2003 | Knecht | .................. | H03B 5/326 331/107 A |
| 7,456,552 B2 | 11/2008 | Chiba et al. | | |
| 2003/0025567 A1 * | 2/2003 | Kubo | ..................... | H03B 5/368 331/158 |
| 2003/0058056 A1 * | 3/2003 | Moriya | .................. | H03B 5/368 331/158 |
| 2006/0202771 A1 * | 9/2006 | Seki | ....................... | G04C 13/00 331/158 |

(Continued)

FOREIGN PATENT DOCUMENTS

JP 2006-050529 A 2/2006

*Primary Examiner* — Levi Gannon
(74) *Attorney, Agent, or Firm* — Oliff PLC

(57) ABSTRACT

A temperature-compensated oscillator includes a resonator element, an oscillating circuit, and a temperature compensation circuit, and a frequency deviation with respect to a frequency at a time point when power supply starts is within a range of ±8 ppb at a time point when 10 seconds elapse from when the power supply starts, within a range of ±10 ppb at a time point when 20 seconds elapse from when the power supply starts, and within a range of ±10 ppb at a time point when 30 seconds elapse from when the power supply starts.

15 Claims, 13 Drawing Sheets

(56) References Cited

U.S. PATENT DOCUMENTS

| | | | | |
|---|---|---|---|---|
| 2008/0016963 A1* | 1/2008 | Watanabe | ............... | G01P 1/023 73/514.29 |
| 2008/0068102 A1* | 3/2008 | Moriya | ................... | H03B 5/36 331/68 |
| 2012/0248943 A1* | 10/2012 | Ogashiwa | ............ | H03H 9/0547 310/363 |

* cited by examiner

| No. | Vcc | | |
|---|---|---|---|
| | 3.135 V | 3.3 V | 3.465 V |
| 1 | -0.041 | 0.000 | 0.039 |
| 2 | -0.040 | 0.000 | 0.039 |
| 3 | -0.040 | 0.000 | 0.038 |
| 4 | -0.041 | 0.000 | 0.040 |
| 5 | -0.040 | 0.000 | 0.039 |
| 6 | -0.039 | 0.000 | 0.038 |
| 7 | -0.040 | 0.000 | 0.039 |
| 8 | -0.039 | 0.000 | 0.038 |
| 9 | -0.040 | 0.000 | 0.039 |
| 10 | -0.040 | 0.000 | 0.039 |
| Ave. | -0.040 | 0.000 | 0.039 |
| Spec. | WITHIN ±0.1 ppm | | WITHIN ±0.1 ppm |

| No. | Vcc | | |
|---|---|---|---|
| | 3.135 V | 3.3 V | 3.465 V |
| 1 | -0.003 | 0.000 | 0.002 |
| 2 | -0.002 | 0.000 | 0.003 |
| 3 | -0.003 | 0.000 | 0.003 |
| 4 | -0.002 | 0.000 | 0.002 |
| 5 | -0.002 | 0.000 | 0.002 |
| 6 | -0.002 | 0.000 | 0.003 |
| 7 | -0.002 | 0.000 | 0.003 |
| 8 | -0.002 | 0.000 | 0.002 |
| 9 | -0.001 | 0.000 | 0.002 |
| 10 | -0.002 | 0.000 | 0.002 |
| Ave. | -0.002 | 0.000 | 0.002 |
| Spec. | WITHIN ±0.1 ppm | | WITHIN ±0.1 ppm |

| No. | Load_C [ppm] | | |
|---|---|---|---|
| | 13.5 pF | 15 pF | 16.5 pF |
| 1 | -0.004 | 0.000 | 0.005 |
| 2 | -0.004 | 0.000 | 0.003 |
| 3 | -0.005 | 0.000 | 0.006 |
| 4 | -0.004 | 0.000 | 0.005 |
| 5 | -0.005 | 0.000 | 0.005 |
| 6 | -0.004 | 0.000 | 0.003 |
| 7 | -0.004 | 0.000 | 0.004 |
| 8 | -0.005 | 0.000 | 0.004 |
| 9 | -0.005 | 0.000 | 0.005 |
| 10 | -0.005 | 0.000 | 0.004 |
| Ave. | -0.005 | 0.000 | 0.004 |
| Spec. | WITHIN ±0.1 ppm | | WITHIN ±0.1 ppm |

| No. | Load_R // Load_C | | |
|---|---|---|---|
| | 9 kΩ // 9 pF | 10 kΩ // 10 pF | 11 kΩ // 11 pF |
| 1 | 0.003 | 0.000 | 0.002 |
| 2 | 0.003 | 0.000 | -0.001 |
| 3 | 0.002 | 0.000 | 0.000 |
| 4 | 0.001 | 0.000 | -0.002 |
| 5 | 0.002 | 0.000 | -0.002 |
| 6 | 0.001 | 0.000 | -0.002 |
| 7 | 0.004 | 0.000 | -0.001 |
| 8 | 0.002 | 0.000 | 0.000 |
| 9 | 0.002 | 0.000 | 0.000 |
| 10 | 0.003 | 0.000 | -0.001 |
| Ave. | 0.002 | 0.000 | -0.001 |
| Spec. | WITHIN ±0.1 ppm | | WITHIN ±0.1 ppm |

OSCILLATOR, ELECTRONIC APPARATUS, AND VEHICLE

BACKGROUND

1. Technical Field

The present invention relates to an oscillator, an electronic apparatus, and a vehicle.

2. Related Art

A temperature-compensated crystal oscillator (TCXO) has a quartz crystal resonator and an integrated circuit (IC) for oscillating the quartz crystal resonator, wherein the IC compensates (thermally compensates) the deviation (frequency deviation) from the desired frequency (nominal frequency) of the oscillation frequency of the quartz crystal resonator in a predetermined temperature range, and thus, high frequency accuracy can be obtained. Such a temperature-compensated crystal oscillator (TCXO) is disclosed in, for example, JP-A-2006-50529.

Further, the temperature-compensated crystal oscillator is high in frequency stability, and is therefore used for communication equipment and so on for which high performance and high reliability are required.

In general, such an oscillator as described above takes time from when the power is supplied until the frequency becomes stable.

FIG. 24 is a graph showing an example of a cold-start characteristic of a related-art temperature-compensated crystal oscillator. Here, the cold-start characteristic of the oscillator denote temporal characteristic of the output frequency in a period from when the power is supplied (input) to the oscillator to when the action of the oscillator becomes stable. It should be noted that the horizontal axis shown in FIG. 24 represents the elapsed time from when the power supply to the oscillator is started. Further, the vertical axis of the graph shown in FIG. 24 represents the frequency deviation with respect to the frequency at the start-up of the power supply.

In the example shown in FIG. 24, the frequency deviation with respect to the frequency at the start-up of the power supply in the related-art temperature-compensated crystal oscillator is −37 ppb at the time point when 10 seconds have elapsed from the start-up of the power supply, −68 ppb at the time point when 20 seconds have elapsed from the start-up of the power supply, and −72 ppb at the time point when 30 seconds have elapsed from the start-up of the power supply.

However, in the case of using, for example, an oscillator in a communication system, an automated cruise system, or the like, if a period from when the power is supplied to when the frequency becomes stable is long, there is a problem that prompt restoration cannot be achieved in the case in which the system has once been shut down.

SUMMARY

An advantages of some aspects of the invention is to provide an oscillator available for an electronic apparatus and a vehicle for which high frequency accuracy is required early after the start-up of the power supply. Another advantages of some aspects of the invention is to provide an electronic apparatus and a vehicle each including the oscillator described above.

The invention can be implemented as the following forms or application examples.

APPLICATION EXAMPLE 1

An oscillator according to this application example is a temperature-compensated oscillator including a resonator element, an oscillating circuit, and a temperature compensation circuit, wherein a frequency deviation with respect to a frequency at a time point when power supply starts is within a range of ±8 ppb at a time point when 10 seconds elapse from when the power supply starts, within a range of ±10 ppb at a time point when 10 seconds elapse from when the power supply starts, and within a range of ±10 ppb at a time point when 30 seconds elapse from when the power supply starts.

It is also possible to configure a variety of types of oscillation circuit such as a pierce oscillator circuit, an inverter type oscillation circuit, a Colpitts oscillator circuit, or a Hartley oscillator circuit using the resonator element and the oscillating circuit.

Compared to the related-art temperature-compensated oscillator, the oscillator according to this application example has a superior cold-start characteristic that the frequency deviation with respect to the frequency at the time point when the power supply starts is within a range of ±8 ppb at the time point when 10 seconds elapse from when the power supply starts, within a range of ±10 ppb at the time point when 20 seconds elapse from when the power supply starts, and within a range of ±10 ppb at the time point when 30 seconds elapse from when the power supply starts. Therefore, the oscillator according to this application example is also available for the electronic apparatus and the vehicle for which high frequency accuracy is required early after the start-up of the power supply.

APPLICATION EXAMPLE 2

In the oscillator according to the application example described above, a frequency-temperature characteristic may be within a range of ±0.3 ppm taking a nominal frequency as a reference value in a temperature range of no lower than −40° C. and no higher than +85° C.

The oscillator according to this application example has an excellent frequency-temperature characteristic that the frequency-temperature characteristic is within a range of ±0.3 ppm in a temperature range of no lower than −40° C. and no higher than +85° C., and is therefore available for the electronic apparatus and the vehicle for which high frequency accuracy is required.

APPLICATION EXAMPLE 3

In the oscillator according to the application example described above, a power supply voltage variation characteristic in a case of varying a power supply voltage as much as ±5% may be within a range of ±0.1 ppm taking a nominal frequency as a reference value.

The oscillator according to this application example has an excellent power supply voltage variation characteristic that the power supply voltage variation characteristic in the case of varying the power supply voltage as much as ±5% is within a range of ±0.1 ppm, and is therefore available for the electronic apparatus and the vehicle for which high frequency accuracy is required.

APPLICATION EXAMPLE 4

In the oscillator according to the application example described above, a load variation characteristic in a case of varying a load as much as ±10% may be within a range of ±0.1 ppm taking a nominal frequency as a reference value.

The oscillator according to this application example has an excellent load variation characteristic that the load variation characteristic in the case of varying the load as much as ±10% is within a range of ±0.1 ppm, and is therefore available for the electronic apparatus and the vehicle for which high frequency accuracy is required.

APPLICATION EXAMPLE 5

The oscillator according to the application example described above may further include an IC chip provided with the oscillating circuit and the temperature compensation circuit.

Since in the oscillator according to this application example, the oscillating circuit and the temperature compensation circuit are included in the IC chip, reduction in size of the device can be achieved.

APPLICATION EXAMPLE 6

The oscillator according to the application example described above may further include a first container housing the resonator element, and a second container housing the first container and the IC chip, the IC chip is bonded to the first container, a space is disposed between an inner surface of the second container and the first container, and a space is disposed between an inner surface of the second container and the IC chip.

In the oscillator according to this application example, since the IC chip is bonded to the first container, the space is disposed between the inner surface of the second container and the first container, and the space is disposed between the inner surface of the second container and the IC chip, the heat generated in the IC chip is conducted to the resonator element in a short period of time to decrease the temperature difference between the IC chip and the resonator element. As a result, the error in the temperature compensation by the temperature compensation circuit is reduced, and thus it is possible to realize the excellent cold-start characteristic that the frequency deviation with respect to the frequency at the time point when the power supply starts is within a range of ±8 ppb at the time point when 10 seconds elapse from when the power supply starts, within a range of ±10 ppb at the time point when 20 seconds elapse from when the power supply starts, and within a range of ±10 ppb at the time point when 30 seconds elapse from when the power supply starts.

APPLICATION EXAMPLE 7

In the oscillator according to the application example described above, the first container may include a base, and a lid adapted to seal the base and made of metal, and the IC chip may be bonded to the lid.

In the oscillator according to this application example, since the material of the lid to which the IC chip is bonded is metal high in thermal conductivity, the heat generated in the IC chip is conducted to the resonator element in a short period of time to decrease the temperature difference between the IC chip and the resonator element. As a result, the error in the temperature compensation by the temperature compensation circuit is reduced, and thus it is possible to realize the excellent cold-start characteristic that the frequency deviation with respect to the frequency at the time point when the power supply starts is within a range of ±8 ppb at the time point when 10 seconds elapse from when the power supply starts, within a range of ±10 ppb at the time point when 20 seconds elapse from when the power supply starts, and within a range of ±10 ppb at the time point when 30 seconds elapse from when the power supply starts.

APPLICATION EXAMPLE 8

An electronic apparatus according to this application example includes any one of the oscillators described above.

According to this application example, the electronic apparatus equipped with the oscillator having the excellent cold-start characteristic can be realized.

APPLICATION EXAMPLE 9

A vehicle according to this application example includes any one of the oscillators described above.

According to this application example, the vehicle equipped with the oscillator having the excellent cold-start characteristic can be realized.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A preferred embodiment of the invention will hereinafter be described in detail using the accompanying drawings. It should be noted that the embodiment described below does not unreasonably limit the contents of the invention as set forth in the appended claims. Further, all of the constituents explained hereinafter are not necessarily essential elements of the invention.

1. Oscillator 1.1. Configuration of Oscillator

Figure 1:
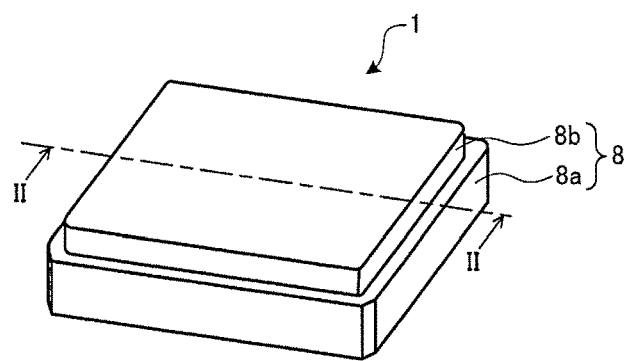
FIG. 1 is a perspective view schematically showing an oscillator according to an embodiment of the invention.
Figure 2:
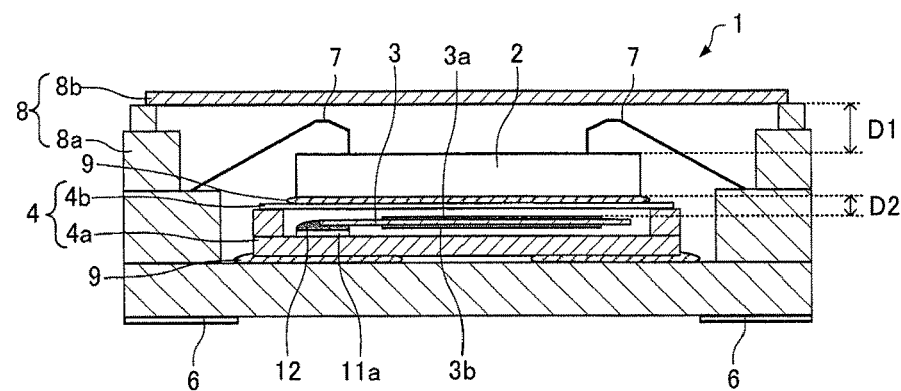
FIG. 2 is a cross-sectional view schematically showing the oscillator according to the embodiment.
Figure 3:
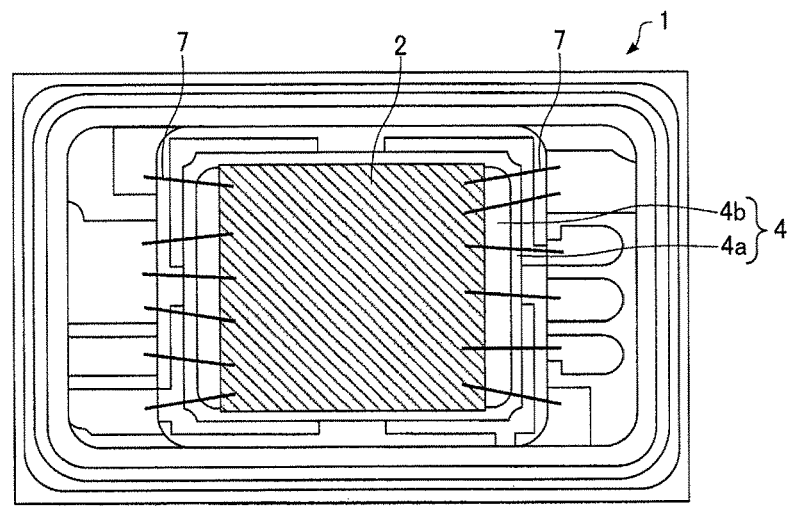
FIG. 3 is a plan view schematically showing the oscillator according to the embodiment.
Figure 4:
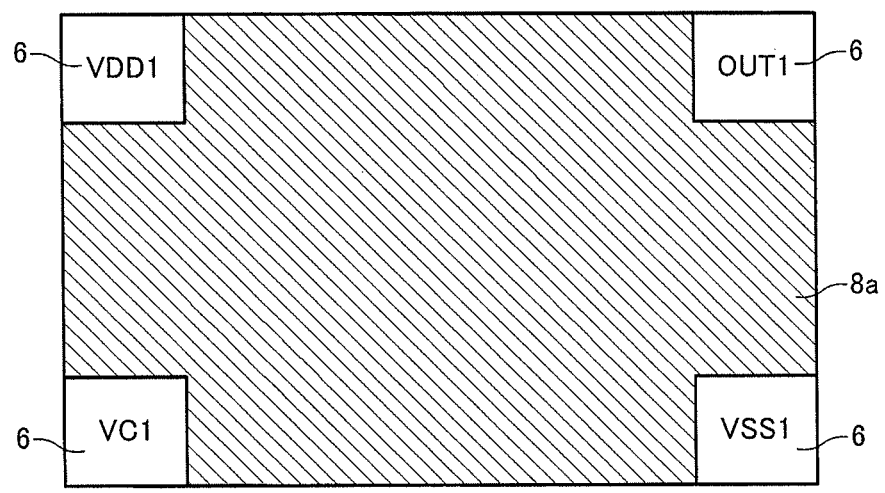
FIG. 4 is a bottom view schematically showing the oscillator according to the embodiment.

FIG. 1 through FIG. 4 are diagrams schematically showing an example of a structure of an oscillator 1 according to the present embodiment. FIG. 1 is a perspective view of the oscillator 1. FIG. 2 is a cross-sectional view along the line II-II line in FIG. 1. FIG. 3 is a top view of the oscillator 1. FIG. 4 is a bottom view of the oscillator 1. It should be noted that in FIG. 3, a lid 8b is omitted from the drawing for the sake of convenience.

As shown in FIG. 1 through FIG. 4, the oscillator 1 is configured including an integrated circuit (IC) 2, a resonator element 3, a package (a first container) 4, a package (a second container) 8.

The integrated circuit (IC) 2 is housed in the package 8. In the package 8, the integrated circuit (IC) 2 is bonded (fixed) to the package 4 (a lid 4b) with a bonding member 9. As described later, the integrated circuit (IC) 2 is configured including an oscillating circuit 10 and a temperature compensation circuit 40 (see FIG. 6).

As the resonator element 3, there can be used, for example, a quartz crystal resonator element, a surface acoustic wave (SAW) resonator element, other piezoelectric resonator elements, or an MEMS (Micro Electro Mechanical Systems) resonator element. As a substrate material of the resonator element 3, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation unit of the resonator element 3, there can be used a device using a piezoelectric effect, or electrostatic drive using coulomb force.

The resonator element 3 has an excitation electrode 3a and an excitation electrode 3b each made of metal and respectively disposed on the obverse side and the reverse side of the resonator element 3, and oscillates with a desired frequency (a frequency required for the oscillator 1) corresponding to the mass of the resonator element 3 including the excitation electrode 3a and the excitation electrode 3b.

The package 4 includes a base (package base) 4a, and a lid 4b sealing the base 4a. The package 4 houses the resonator element 3. Specifically, the base 4a is provided with a recessed part, and the recessed part is covered with the lid 4b to thereby house the resonator element 3. A space of the package 4 for housing the resonator element 3 is provided with, for example, an inert gas atmosphere with, for example, a nitrogen gas. The base 4a is bonded (fixed) to a base 8a of the package 8 with a bonding member 9 made of a resin or the like.

Figure 5:
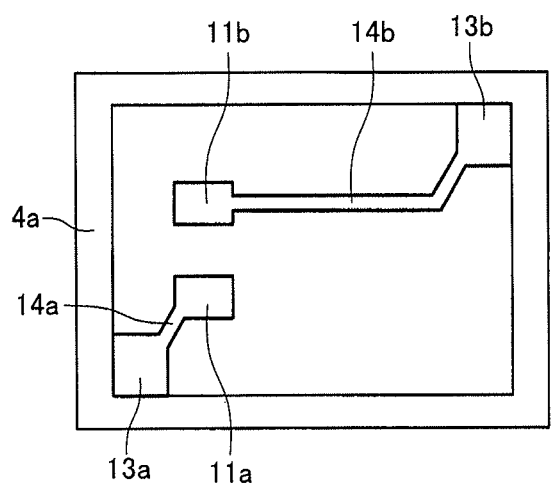
FIG. 5 is a plan view schematically showing a base of a package of the oscillator according to the embodiment.

FIG. 5 is a plan view schematically showing the base 4a of the package 4.

As shown in FIG. 5, on the base 4a, there are disposed electrode pads 11a, 11b, electrode pads 13a, 13b, and extraction interconnections 14a, 14b. It should be noted that in the case of the present embodiment, the base 4a is provided with a base main body shaped like a plate on which the electrode pads 11a, 11b are disposed, and a frame body surrounding the electrode pads 11a, 11b.

The electrode pads 11a, 11b are electrically connected respectively to the two excitation electrodes 3a, 3b of the resonator element 3. To the electrode pads 11a, 11b, there is bonded (fixed) the resonator element 3 with a connection member 12 such as an electrically conductive adhesive.

The electrode pads 13a, 13b are electrically connected respectively to two external terminals (not shown) of the package 4. To the two external terminals of the package 4, there are electrically connected two terminals (an XO terminal and an XI terminal shown in FIG. 6 described later) of the integrated circuit (IC) 2, respectively.

The extraction interconnection 14a electrically connects the electrode pad 11a and the electrode pad 13a to each other. The extraction interconnection 14b electrically connects the electrode pad 11b and the electrode pad 13b to each other.

As shown in FIG. 2, the integrated circuit (IC) 2 is bonded (fixed) to the lid 4b with the bonding member 9. It is preferable for the bonding member 9 to be, for example, an electrically conductive adhesive. As shown in FIG. 3, the integrated circuit (IC) 2 and the package 4 (the resonator element 3) overlap each other in a planar view of the oscillator 1 viewed from the upper surface, and the integrated circuit (IC) 2 is directly mounted on the lid 4b. As described above, in the oscillator 1, by bonding the integrated circuit (IC) 2 to the lid 4b of the package 4 in which the resonator element 3 is housed, the integrated circuit (IC) 2 and the resonator element 3 can be disposed adjacent to each other. Thus, since the heat generated in the integrated circuit (IC) 2 is conducted to the resonator element 3 in a short period of time, the temperature difference between the integrated circuit (IC) 2 and the resonator element 3 can be made small.

The material of the base 4a is not particularly limited, but a variety of types of ceramics such as an aluminum oxide can be used therefor. The material of the lid 4b is, for example, metal. It is desirable for the material of the lid 4b to be a material high in thermal conductivity, and there can be used, for example, nickel (Ni), cobalt (Co), and an iron alloy (e.g., Kovar). Further, it is also possible for the lid 4b to be formed of a plate-like member coated with the metal high in thermal conductivity described above. Since the heat generated in the integrated circuit (IC) 2 is conducted to the resonator element 3 in a short period of time by adopting the metal high in thermal conductivity as the material of the lid 4b, the temperature difference between the integrated circuit (IC) 2 and the resonator element 3 can be made small. Further, for example, if at least a part of a surface of the lid 4b having contact with the bonding member 9 is in a coarse state (a coarse surface), the bonding state with the bonding member 9 becomes good to thereby improve impact resistance and a heat exchanging performance. It should be noted that the coarse surface is in the state of having unevenness formed by laser processing, and is coarser compared to, for example, the surface on the housing space side on which such processing is not performed.

It is also possible for the base 4a to be provided with a metal body for sealing disposed between the ceramic member and a seal-bonding part of the lid 4b. The metal body can also be the frame body described above, or can also be disposed on a frame body made of ceramic, or can also be a so-called seam ring made of, for example, a cobalt alloy for seam-sealing, or can also be what has a configuration of directly disposing a metal film on the ceramic member.

In this case, since the metal film is easier to be reduced in thickness than the seam ring, the configuration of disposing the metal film directly on the ceramic member can shorten the distance between the lid 4b and the ceramic member to thereby make it easier to transfer the heat, which transferred from the lid 4b, to the ceramic member, namely the resonator element 3, compared to the case of the seam ring.

Further, it is also possible for the lid 4b to be warped so that the resonator element 3 side becomes in the convex state and the integrated circuit (IC) 2 side becomes in the concave state in the state in which the lid 4b is sealed with the base 4a. If a concave region due to such warpage is located in an area overlapping the integrated circuit (IC) 2, it becomes easy to keep the bonding member 9 in the concave region. Further, due to the above, since it is possible to dispose sufficient amount of the bonding member 9 between the integrated circuit (IC) 2 and the lid 4b, bonding between the integrated circuit (IC) 2 and the lid 4b becomes in good condition, and the heat exchanging performance between the integrated circuit (IC) 2, and the lid 4b and the base 4a, namely between the integrated circuit (IC) 2 and the resonator element 3, is improved.

Further, since the lid 4b is convex toward the resonator element 3, there occurs the state in which the lid 4b is located closer to the resonator element 3 compared to the case in which the lid 4b is completely flat, and it becomes easy for the heat from the integrated circuit (IC) 2 to be transferred to the resonator element 3 via the lid 4b.

It should be noted that as a method of warping the lid 4b, there is prepared the lid 4b which is, for example, flat in the state in which the lid 4b is not fixed to the base 4a, and then the lid 4b and the base 4a are stacked on one another.

After stacking the lid 4b and the base 4a on one another, the lid 4b and the base 4a are bonded to each other while heating the lid 4b and the base 4a.

When thus heating the lid 4b and the base 4a, the temperature of the lid 4b is lowered to a level lower than the temperature of the base main body of the base 4a, or the lid 4b lower in thermal expansion coefficient than the base main body is selected. Alternatively, it is also possible to adopt both of them. Thus, since the lid 4b contracts more than the base 4a when the lid 4b and the base 4a drop in temperature after sealing, the lid 4b can easily be warped.

Further, by also warping the base 4a convexly toward the opposite side to the resonator element 3 side, it is possible to provide a large gap between the base main body and the package 8 described later to thereby degrade the heat exchanging performance between the base 4a and the package 8. It should be noted that it is also possible to provide the base main body constituting the gap with a pad electrode for mounting, and dispose a pad electrode for installation on a surface of the package 8 opposed to the pad electrode for mounting, and then perform solder-bonding between the pad electrode for mounting and the pad electrode for installation. According also to such a configuration, since the solder increases in thickness as much as the increment of the gap compared to the case in which the base 4a is flat, the heat exchanging performance between the base 4a and the package 8 via the solder degrades, and the oscillator 1 hard to be affected by disturbance is obtained.

The package 8 includes a base (package base) 8a, and a lid 8b sealing the base 8a. The package 8 houses the package 4, in which the resonator element 3 is housed, and the integrated circuit (IC) 2 in the same space. Specifically, the base 8a is provided with a recessed part, and the recessed part is covered with the lid 8b to thereby house the integrated circuit (IC) 2 and the package 4. A space of the package 8 for housing the integrated circuit (IC) 2 and the package 4 is provided with, for example, an inert gas atmosphere with, for example, a nitrogen gas.

Between the inner surface of the package 8 and the package 4, there is disposed a space. In the example shown in the drawings, the inner wall surface of the base 8a and the package 4 do not have contact with each other, and a space (gap) is disposed therebetween. Further, the lid 8b and the package 4 do not have contact with each other, and a space (gap) is disposed therebetween.

Between the inner surface of the package 8 and the integrated circuit (IC) 2, there is disposed a space. In the example shown in the drawings, the inner wall surface of the base 8a and the integrated circuit (IC) 2 do not have contact with each other, and a space (gap) is disposed therebetween. Further, the lid 8b and the integrated circuit (IC) 2 do not have contact with each other, and a space (gap) is disposed therebetween.

The material of the base 8a is not particularly limited, but a variety of types of ceramics such as an aluminum oxide can be used therefor. The material of the lid 8b is, for example, metal. The lid 8b of the present embodiment has a plate-like shape (flat shape), and is small in area compared to the cap-like shape obtained by bending work to have a concave shape using a metal mold or the like. Therefore, since it is easy to ward off the wind from the lateral direction of the package, it is possible to prevent the temperature variation due to the outside air. It should be noted that a seal-bonding member is disposed for bonding the base 8a and the lid 8b made of ceramic. The seal-bonding member is a metal seal-bonding member including a material such as a cobalt alloy or Au, or a nonmetal seal-bonding member such as glass or resin.

In the oscillator 1, the distance D1 between the lid 8b of the package 8 and the integrated circuit (IC) 2 is longer than the distance D2 between the integrated circuit (IC) 2 and the resonator element 3. In the example shown in the drawings, the distance D1 is the distance between the lower surface of the lid 8b and the upper surface of the integrated circuit (IC) 2, and the distance D2 is the distance between the lower surface of the integrated circuit (IC) 2 and the upper surface of the resonator element 3. As described above, by locating the integrated circuit (IC) 2 closer to the resonator element 3 than the lid 8b, the temperature difference between the integrated circuit (IC) 2 and the resonator element 3 can be decreased.

On the surfaces of the inside or the recessed part of the base 8a, there are disposed interconnections not shown for electrically connecting two terminals (the XO terminal and the XI terminal shown in FIG. 6 described later) of the integrated circuit (IC) 2 and two terminals (the excitation electrode 3a and the excitation electrode 3b) of the resonator element 3 respectively to each other. Further, on the surfaces of the inside or the recessed part of the base 8a, there are disposed interconnections not shown electrically connected to the respective externals 6, and the interconnections and the terminals of the integrated circuit (IC) 2 are respectively bonded to each other with respective bonding wires 7 made of gold or the like.

It should be noted that, for example, if at least a part of a surface of the integrated circuit (IC) 2 having contact with the bonding member 9 is in a coarse state (a coarse surface), the bonding state with the bonding member 9 becomes good to thereby improve the impact resistance and the heat exchanging performance. It should be noted that the coarse surface is a surface in the state of having asperity shaped like streaks or the like formed by, for example, cutting work.

As shown in FIG. 4, the oscillator 1 is provided with four external terminals 6, namely an external terminal VDD1 as a power supply terminal, an external terminal VSS1 as a ground terminal, an external terminal VC1 as a terminal to which a signal for controlling the frequency is input, and an external terminal OUT1 as an output terminal, disposed on the bottom surface (a reverse surface of the base 8a). The external terminal VDD1 is supplied with the power supply voltage, and the external terminal VSS1 is grounded.

Figure 6:
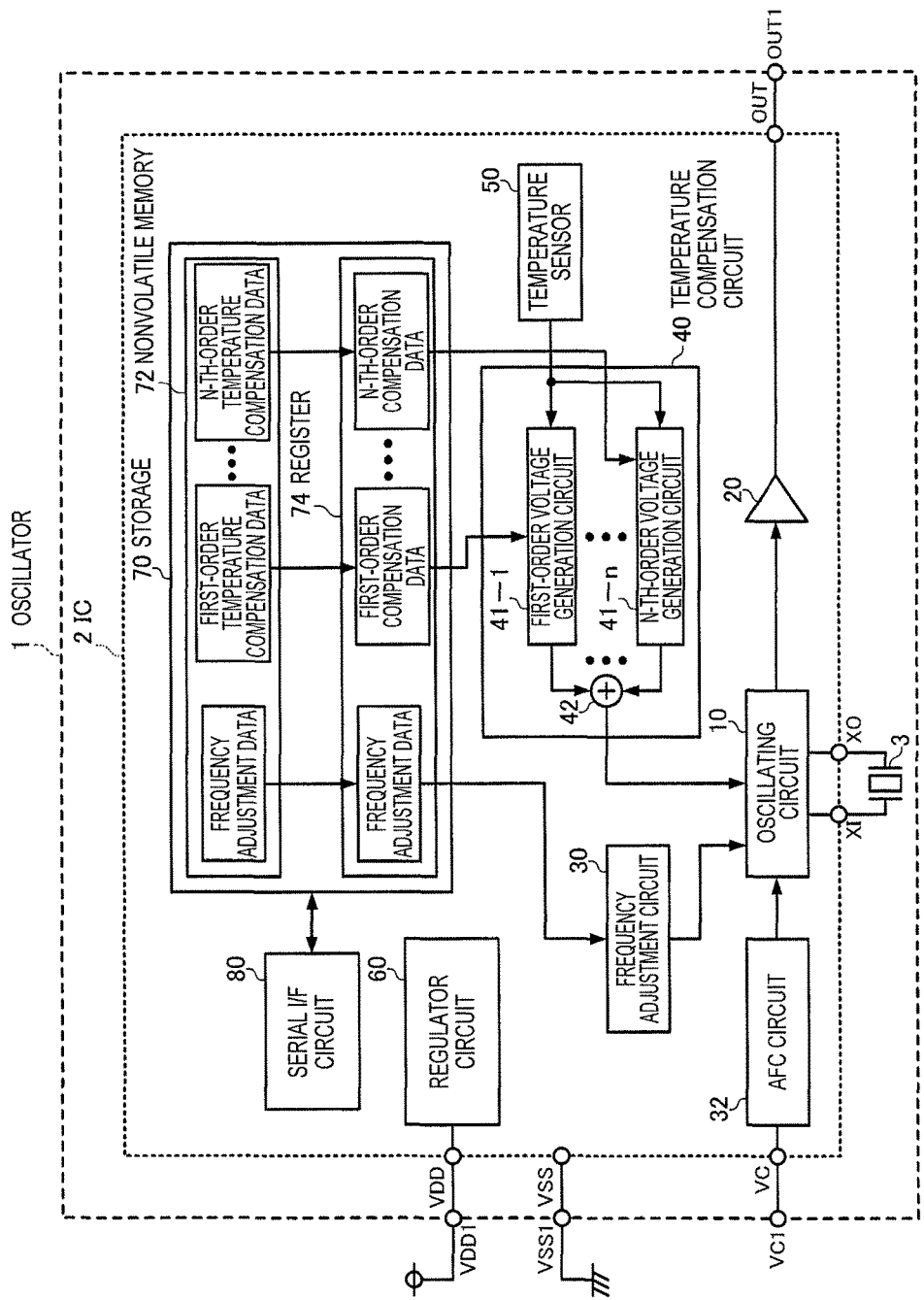
FIG. 6 is a functional block diagram of the oscillator according to the embodiment.

FIG. 6 is a functional block diagram of the oscillator 1. As shown in FIG. 6, the oscillator 1 is an oscillator including the resonator element 3, and the integrated circuit (IC) 2 for oscillating the resonator element 3.

The integrated circuit (IC) 2 is provided with a VDD terminal as a power supply terminal, a VSS terminal as a ground terminal, an OUT terminal as an output terminal, a VC terminal as a terminal to which a signal for controlling the frequency is input, and the XI terminal and the XO terminal as connection terminals with the resonator element 3. The VDD terminal, the VSS terminal, the OUT terminal, and the VC terminal are exposed on the surface of the integrated circuit (IC) 2, and are connected respectively to the external terminals VDD1, VSS1, OUT1, and VC1 provided to the package 8. Further, the XI terminal is connected to one end (one terminal) of the resonator element 3, and the XO terminal is connected to the other end (the other terminal) of the resonator element 3.

In the present embodiment, the integrated circuit (IC) 2 is configured including an oscillating circuit 10, an output circuit 20, a frequency adjustment circuit 30, an automatic frequency control (AFC) circuit 32, a temperature compensation circuit 40, a temperature sensor 50, a regulator circuit 60, a storage 70, and a serial interface (I/F) circuit 80. It should be noted that the integrated circuit (IC) 2 can have a configuration obtained by eliminating or modifying some of these constituents, or adding other constituents.

The regulator circuit 60 generates a constant voltage to be a power supply voltage or a reference voltage of some or all of the oscillating circuit 10, the frequency adjustment circuit 30, the AFC circuit 32, the temperature compensation circuit 40, and the output circuit 20 based on the power supply voltage VDD (positive voltage) supplied from the VDD terminal.

The storage 70 has a nonvolatile memory 72 and a register 74, and is configured so that reading from and writing to the nonvolatile memory 72 or the register 74 can be performed from the external terminals via the serial interface circuit 80. In the present embodiment, since the integrated circuit (IC) 2 has only four terminals to be connected to the external terminals of the oscillator 1, namely the VDD terminal, the VSS terminal, the OUT terminal, and the VC terminal, for example, when the voltage of the VDD terminal is higher than a threshold value, the serial interface circuit 80 accepts a clock signal input from the VC terminal and a data signal input from the OUT terminal, and then performs reading/writing of the data from/to the nonvolatile memory 72 or the register 74.

The nonvolatile memory 72 is a storage for storing a variety of control data, and can be a variety of types of rewritable nonvolatile memory such as an electrically erasable programmable read-only memory (EEPROM) or a flash memory, or can also be a variety of types of non-rewritable nonvolatile memory such as a one-time programmable read-only memory (one-time PROM).

The nonvolatile memory 72 stores frequency adjustment data for controlling the frequency adjustment circuit 30, and temperature compensation data (first-order compensation data, . . . , n-th-order compensation data) for controlling the temperature compensation circuit 40. Further, the nonvolatile memory 72 also stores data (not shown) for respectively controlling the output circuit 20 and the AFC circuit 32.

The frequency adjustment data is the data for adjusting the frequency of the oscillator 1, and in the case in which the frequency of the oscillator 1 is shifted from the desired frequency, it is possible to finely adjust the frequency of the oscillator 1 so as to come closer to the desired frequency by rewriting the frequency adjustment data.

The temperature compensation data (the first-order compensation data, . . . , n-th-order compensation data) are the data for compensating the frequency-temperature characteristic of the oscillator 1 and calculated in a temperature compensation adjustment process of the oscillator 1, and can also be, for example, first-order through n-th-order coefficient values corresponding to the respective order components in the frequency temperature characteristic of the resonator element 3. Here, as the highest order n of the temperature compensation data, there is selected a value with which the frequency-temperature characteristic of the resonator element 3 is canceled out, and an influence of the temperature characteristic of the integrated circuit (IC) 2 can also be corrected. For example, the value n can also be an integer value greater than a principal order of the frequency-temperature characteristic of the resonator element 3. For example, if the resonator element 3 is an AT-cut quartz crystal resonator element, the frequency-temperature characteristic exhibits a cubic curve, and since the principal order thereof is three, an integer value (e.g., five or six) greater than three can also be selected as the value n. It should be noted that the temperature compensation data can include all of the first-order through n-th-order compensation data, or some of the first-order through n-th-order compensation data.

Each of the data stored in the nonvolatile memory 72 is transferred from the nonvolatile memory 72 to the register 74 when powering on (when the voltage of the VDD terminal rises from 0 V to a desired voltage) the integrated circuit (IC) 2, and is then held in the register 74. Then, the frequency adjustment data to be held in the register 74 is input to the frequency adjustment circuit 30, the temperature compensation data (the first-order compensation data, . . . , n-th-order compensation data) to be held in the register 74 are input to the temperature compensation circuit 40, and the data for the control to be held in the register 74 are also input to the output circuit 20 and the AFC circuit 32.

In the case in which the nonvolatile memory 72 is non-rewritable, the data are directly written into the respective bits of the register 74, which holds the data transferred from the nonvolatile memory 72, from the external terminals via the serial interface circuit 80, then adjusted/selected so that the oscillator 1 fulfills the desired characteristic, and then each of the data thus adjusted/selected is finally written into the nonvolatile memory 72 when inspecting the oscillator 1. Further, in the case in which the nonvolatile memory 72 is rewritable, it is also possible to arrange that each of the data is written into the nonvolatile memory 72 from the external terminals via the serial interface circuit 80 when inspecting the oscillator 1. It should be noted that since writing to the nonvolatile memory 72 generally takes time, when inspecting the oscillator 1, in order to shorten the inspection time, it is also possible to arrange that the data are directly written into the respective bits of the register 74 from the external terminals via the serial interface circuit 80, and then each of the data adjusted/selected is finally written into the nonvolatile memory 72.

The oscillating circuit 10 amplifies the output signal of the resonator element 3 to feed back the result to the resonator element 3 to thereby oscillate the resonator element 3, and then outputs an oscillation signal based on the oscillation of the resonator element 3. For example, the oscillation stage current of the oscillating circuit 10 can be controlled by the control data held in the register 74.

The frequency adjustment circuit 30 generates the voltage corresponding to the frequency adjustment data held in the register 74, and then applies the voltage to an end of a variable capacitance element (not shown) functioning as a load capacitance of the oscillating circuit 10. Thus, the oscillation frequency (the reference frequency) of the oscillating circuit 10 at a predetermined temperature (e.g., 25° C.) and under the condition in which the voltage of the VC terminal becomes a predetermined voltage (e.g., VDD/2) is controlled (finely adjusted) so as to become roughly the desired frequency.

The AFC circuit 32 generates the voltage corresponding to the voltage of the VC terminal, and then applies the voltage to an end of a variable capacitance element (not shown) functioning as a load capacitance of the oscillating circuit 10. Thus, the oscillation frequency (the frequency of the resonator element 3) of the oscillating circuit 10 is controlled based on the voltage value of the VC terminal. For example, the gain of the AFC circuit 32 can also be controlled by the control data held in the register 74.

The temperature sensor 50 is a thermosensor for outputting a signal (e.g., a voltage corresponding to the temperature) corresponding to the ambient temperature of the thermosensor. The temperature sensor 50 can be a positive type, in which the higher the temperature is, the higher the output voltage is, or can also be a negative type, in which the higher the temperature is, the lower the output voltage is. It should be noted that a device, the output voltage of which varies as linearly as possible with respect to the change in temperature in a desired temperature range in which the operation of the oscillator 1 is guaranteed is desirable as the temperature sensor 50.

An output signal from the temperature sensor 50 is input to the temperature compensation circuit 40, and the temperature compensation circuit 40 generates the voltage (temperature compensation voltage) for compensating the frequency-temperature characteristic of the resonator element 3, and then applies the voltage to an end of a variable capacitance element (not shown) functioning as a load capacitance of the oscillating circuit 10. Thus, the oscillation frequency of the oscillating circuit 10 is controlled so as to be roughly constant irrespective of the temperature. In the present embodiment, the temperature compensation circuit 40 is configured including a first-order voltage generation circuit 41-1 through an n-th-order voltage generation circuit 41-n, and an adder circuit 42.

The output signal from the temperature sensor 50 is input to each of the first-order voltage generation circuit 41-1 through the n-th-order voltage generation circuit 41-n, and the first-order voltage generation circuit 41-1 through the n-th-order voltage generation circuit 41-n generate a first-order compensation voltage through an n-th-order compensation voltage for compensating the first-order component through the n-th-order component of the frequency-temperature characteristic in accordance with the first-order compensation data through the n-th-order compensation data held in the register 74, respectively.

The adder circuit 42 adds the first-order compensation voltage through the n-th-order compensation voltage respectively generated by the first-order voltage generation circuit 41-1 through the n-th-order voltage generation circuit 41-n to each other, and then outputs the result. The output voltage of the adder circuit 42 becomes the output voltage (the temperature compensation voltage) of the temperature compensation circuit 40.

The oscillation signal output by the oscillating circuit 10 is input to the output circuit 20, and the output circuit 20 generates an oscillation signal for external output, and then outputs the oscillation signal to the outside via the OUT terminal. For example, the division ratio and the output level of the oscillation signal in the output circuit 20 can be controlled by the control data held in the register 74. The output frequency range of the oscillator 1 is, for example, no lower than 10 MHz and no higher than 800 MHz.

The oscillator 1 configured as described above functions as a voltage-controlled temperature-compensated oscillator (a voltage-controlled temperature-compensated crystal oscillator (VC-TCXO) if the resonator element 3 is a quartz crystal resonator element) for outputting the oscillation signal with a constant frequency corresponding to the voltage of the external terminal VC1 in a desired temperature range irrespective of the temperature.

1.2. Method of Manufacturing Oscillator

Figure 7:
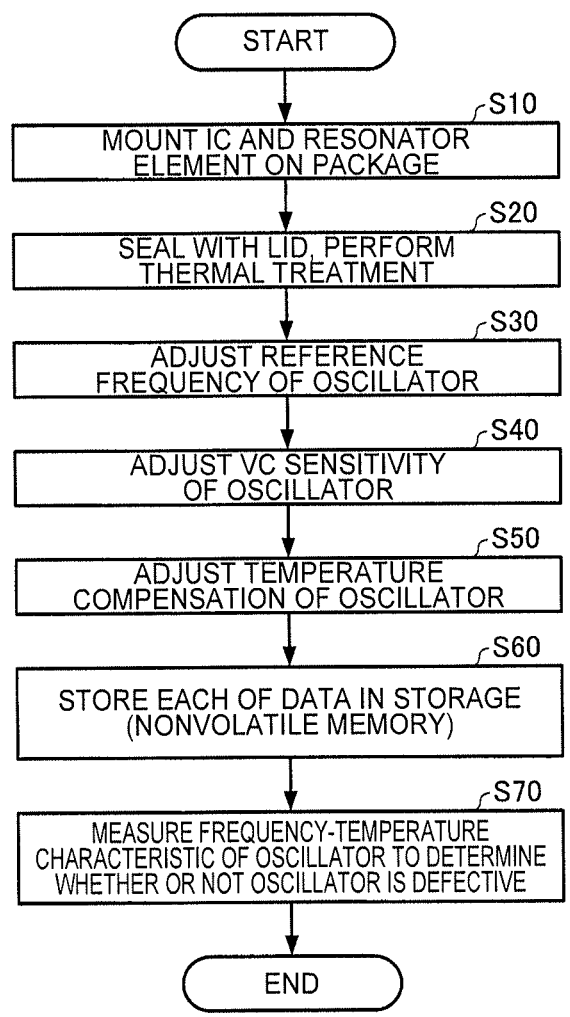
FIG. 7 is a flowchart showing an example of a procedure of a method of manufacturing the oscillator according to the embodiment.

FIG. 7 is a flowchart showing an example of a procedure of a method of manufacturing the oscillator 1 according to the present embodiment. It is also possible to eliminate or modify a part of the processes S10 through S70 shown in FIG. 7, or add other processes. Further, it is possible to arbitrarily change the order of the processes to the extent possible.

In the example shown in FIG. 7, firstly, the integrated circuit (IC) 2 and the resonator element 3 (the package 4 housing the resonator element 3) are mounted (S10) on the package 8 (the base 8a). Due to the process S10, the integrated circuit (IC) 2 and the resonator element 3 are connected to each other with interconnections disposed on the surfaces of the inside or the recessed part of the base 8a, to achieve the state in which the integrated circuit (IC) 2 and the resonator element 3 are electrically connected to each other when supplying the integrated circuit (IC) 2 with the electrical power.

Then, the base 8a is sealed with the lid 8b, and then a thermal treatment is performed to bond (S20) the lid 8b to the base 8a. Due to the process S20, assembling of the oscillator 1 is completed.

Then, the reference frequency (the frequency at the reference temperature T0 (e.g., 25° C.)) of the oscillator 1 is adjusted (S30). In this process S30, the oscillator 1 is oscillated at the reference temperature T0 to measure the frequency, and then the frequency adjustment data is determined so that the frequency deviation comes closer to zero.

Then, the VC sensitivity of the oscillator 1 is adjusted (S40). In this process S40, the oscillator 1 is oscillated to measure the frequency in the state of applying a predetermined voltage (e.g., 0 V or VDD) to the external terminal VC1 at the reference temperature T0, and then the adjustment data of the AFC circuit 32 is determined so that the desired VC sensitivity can be obtained.

Then, the temperature compensation adjustment of the oscillator 1 is performed (S50). In this temperature compensation adjustment process S50, the frequency of the oscillator 1 is measured at a plurality of temperature points in the desired temperature range (e.g., no lower than −40° C. and no higher than 85° C.), and the temperature compensation data (the first-order compensation data, . . . , n-th-order compensation data) for correcting the frequency-temperature characteristic of the oscillator 1 are generated based on the measurement result. Specifically, a calculation program for the temperature compensation data approximates the frequency-temperature characteristic (including the frequency-temperature characteristic of the resonator element 3 and the temperature characteristic of the integrated circuit (IC) 2) of the oscillator 1 by an n-th-order formula with the temperature (an output voltage of the temperature sensor 50) as a variable using the measurement result of the frequency at the plurality of temperature points, and then generates the temperature compensation data (the first-order compensation data, . . . , n-th-order compensation data) corresponding to the approximation formula. For example, the calculation program for the temperature compensation data generates such temperature compensation data (the first-order compensation data, . . . , n-th-order compensation data) as to vanish the frequency deviation at the reference temperature T0, and decrease the width of the frequency deviation in the desired temperature range.

Then, the data respectively obtained in the processes S30, S40, and S50 are stored (S60) in the nonvolatile memory 72 of the storage 70.

Finally, the frequency-temperature characteristic of the oscillator 1 is measured to determine (S70) whether or not the oscillator 1 is defective. In this process S70, the frequency of the oscillator 1 is measured while gradually changing the temperature to evaluate whether or not the frequency deviation is within a predetermined range in the desired temperature range (e.g., no lower than −40° C. and no higher than 85° C.), and if the frequency deviation is within the predetermined range, it is determined that the oscillator 1 is a non-defective product, or if the frequency deviation is not within the predetermined range, it is determined that the oscillator 1 is a defective product.

1.3. Cold-Start Characteristic of Oscillator

The cold-start characteristic of the oscillator denotes temporal characteristic of the output frequency in a period from when the power is supplied (input) to the oscillator to when the action of the oscillator becomes stable.

Figure 8:
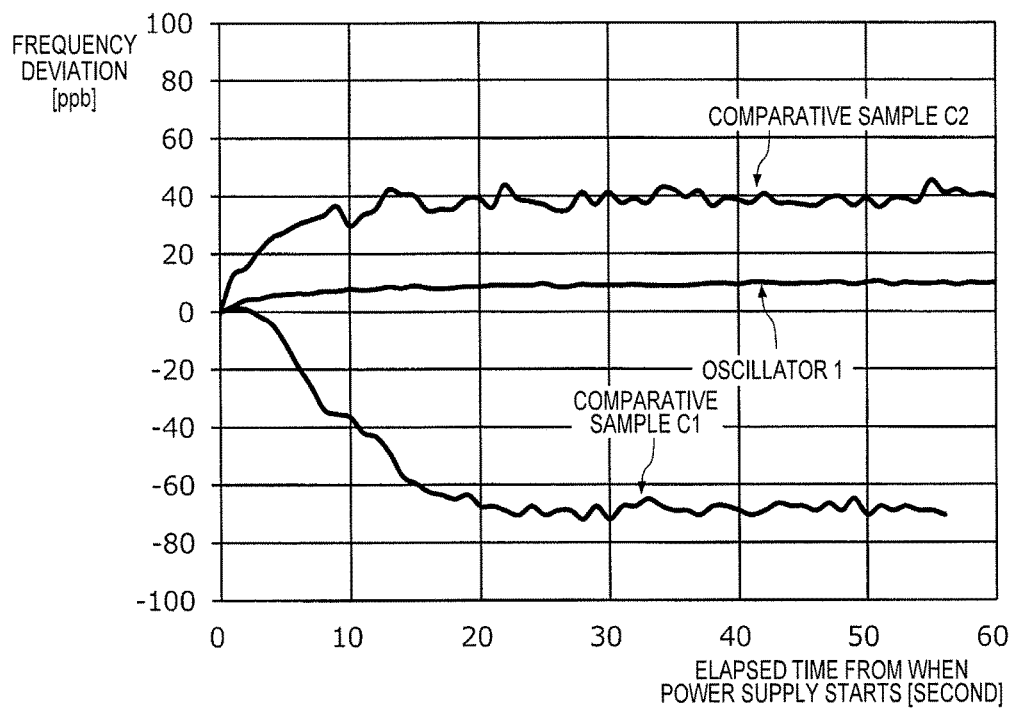
FIG. 8 is a graph showing a result of evaluation of a cold-start characteristic of the oscillator according to the embodiment.

FIG. 8 is a graph showing an evaluation result of the cold-start characteristic of the oscillator 1. The horizontal axis of the graph shown in FIG. 8 represents the elapsed time (the time from when powering ON the oscillator) after the power supply to the oscillator is started in the state in which the power is not supplied to the oscillator. Further, the vertical axis of the graph shown in FIG. 8 represents the frequency deviation dF (a deviation of the frequency thus measured from the frequency at the time point when the power supply starts) with respect to the frequency (the frequency at the time point when the power supply starts) at the time point when the power supply to the oscillator starts. It should be noted that FIG. 8 shows the evaluation result of the oscillator 1, and the evaluation result of two related-art temperature-compensated crystal oscillators (a comparative sample C1, a comparative sample C2).

Here, the frequency of the oscillator 1 was measured from the start of the power supply at intervals of one second, and then the frequency deviation dF with respect to the frequency at the time point when the power supply started was obtained to draw the graph shown in FIG. 8. It should be noted that as the frequency at the time point when the power supply started, the frequency at the time point when one second elapsed after the power supply to the oscillator 1 had have started was set. Further, the measurement of the frequency was performed in the state in which the oscillator 1 was kept constant at the reference temperature T0. The reference temperature T0 was set to 25° C. Substantially the same measurement was performed also on the comparative sample C1 and the comparative sample C2 to draw the graph shown in FIG. 8.

The configuration of the oscillator 1 used for the present evaluation is as explained in "1.1. Configuration of Oscillator" (see FIG. 1 through FIG. 4) described above. It should be noted that the space of the package 4, in which the resonator element 3 is housed, and the space of the package 8, in which the integrated circuit (IC) 2 and the package 4 are housed, are each provided with a nitrogen gas atmosphere. Further, the resonator element 3 is a quartz crystal resonator element.

Figure 9:
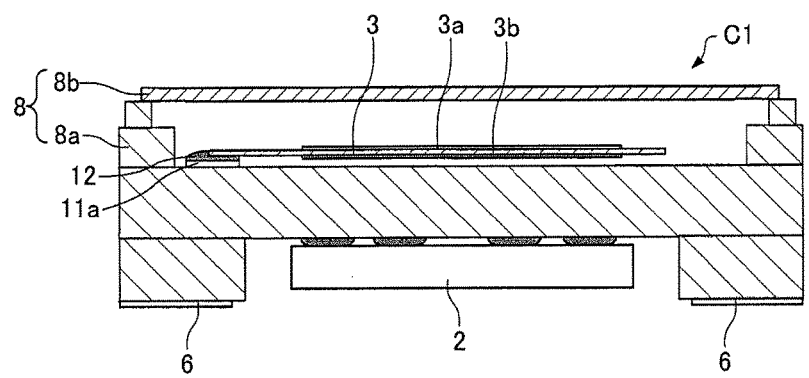
FIG. 9 is a cross-sectional view schematically showing a configuration of a comparative sample.

FIG. 9 is a cross-sectional view schematically showing a configuration of the comparative sample C1.

In the comparative sample C1, as shown in FIG. 9, the base 8a has an H-shaped structure, two principal surfaces of which are each provided with a recessed part. In the comparative sample C1, the resonator element 3 is housed in the recessed part provided to one of the principal surfaces of the base 8a, and the integrated circuit (IC) 2 is housed in the recessed part provided to the other of the principal surfaces. It should be noted that the rest of the configuration of the comparative sample C1 is substantially the same as that of the oscillator 1.

Figure 10:
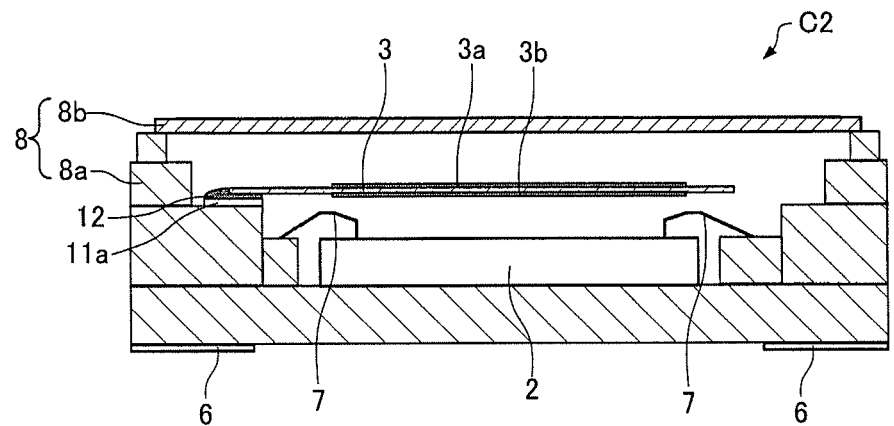
FIG. 10 is a cross-sectional view schematically showing the configuration of the comparative sample.

FIG. 10 is a cross-sectional view schematically showing a configuration of the comparative sample C2.

In the comparative sample C2, as shown in FIG. 10, the package 8 houses the integrated circuit (IC) 2 and the resonator element 3 in the same space. In other words, in the comparative example C2, the resonator element 3 is not housed in the package 4 (see FIG. 2). It should be noted that the rest of the configuration of the comparative sample C2 is substantially the same as that of the oscillator 1.

Table 1 described below shows the evaluation result of the cold-start characteristic of the oscillator 1 shown in FIG. 8 as a table. In Table 1 described below, there are described the frequency deviations dF at time points when 10 seconds, 20 seconds, . . . , 60 seconds have elapsed, respectively, from the time point when the power starts to be supplied to the oscillator 1, to which the power has not been supplied, and which is in the reference temperature state (25° C.) with respect to the frequency at the time point (Time) when the power supply starts. Also in this case, the reference frequency used when calculating the frequency deviation is the frequency at the time point when the power supply starts (the time point when the measurement of the frequency becomes possible after the power is supplied).

TABLE 1

| Time [s] | Oscillator 1 dF [ppb] | Comparative Sample C1 dF [ppb] | Comparative Sample C2 dF [ppb] |
|---|---|---|---|
| 10 | +8  | −37 | +30 |
| 20 | +10 | −68 | +39 |
| 30 | +10 | −72 | +41 |
| 40 | +9  | −69 | +39 |
| 50 | +10 | −71 | +39 |
| 60 | +10 |     | +40 |

It should be noted that although the frequency deviations dF are positive (+) values in the measurement result of the oscillator 1, the frequency deviations dF can also take negative (−) values depending on the conditions such as the reference temperature T0. Even in the case in which the frequency deviations dF take negative values, the absolute values of the frequency deviations dF show the same tendency. The same also applies to the comparative sample C1 and the comparative sample C2.

The result shown in FIG. 8 and Table 1 shows the fact that the oscillator 1 has such an excellent cold-start characteristic that the frequency deviation with respect to the frequency at the time point when the power supply starts is within a range of ±8 ppb at the time point when 10 seconds elapse from when the power supply starts, within a range of ±10 ppb at the time point when 20 seconds elapse from when the power supply starts, and within a range of ±10 ppb at the time point when 30 seconds elapse from when the power supply starts in the reference temperature state (25° C.).

Specifically, as shown in FIG. 8, the oscillator 1 operated at a stable frequency after 20 seconds elapsed from when the power supply started. In other words, in the oscillator 1, the time from when the power supply started to when the operation became stable was 20 seconds. Further, in the oscillator 1, the frequency deviation dF in the stable operation (in the period from when 20 seconds elapsed to when 60 seconds elapsed; 20 s≤t≤60 s, t denotes the time elapsed from when the power supply started) was about +10 ppb.

In contrast, the comparative sample C1 operated at a stable frequency after 30 seconds elapsed from when the power supply started. Further, in the comparative sample C1, the frequency deviation dF in the stable operation (30 s≤t≤60 s) was about −70 ppb.

Further, the comparative sample C2 operated at a stable frequency after 20 seconds elapsed from when the power supply started. Further, in the comparative sample C2, the frequency deviation dF in the stable operation (20 s≤t≤60 s) was about +40 ppb.

As described above, it can be said that compared to the comparative sample C1 and the comparative sample C2, the oscillator 1 is extremely small in the deviation of the frequency in the stable operation from the frequency at the time point when the operation starts, and has a superior cold-start characteristic.

Further, as shown in FIG. 8, the oscillator 1 is smaller in variation of the frequency (frequency variation) during the period (the period from when 20 seconds elapse to when 60 seconds elapse, 20 s≤t≤60 s), in which the operation is stable, compared to the comparative sample C1 and the comparative sample C2. Specifically, in the oscillator 1, the standard deviation σ of the frequency deviation dF in the period from when 20 seconds elapsed to when 60 seconds elapsed was 0.7 ppb. In contrast, in the comparative sample C1, the standard deviation σ of the frequency deviation dF in the period from when 20 seconds elapsed to when 60 seconds elapsed was 1.6 ppb. Further, in the comparative sample C2, the standard deviation σ of the frequency deviation dF in the period from when 20 seconds elapsed to when 60 seconds elapsed was 2.5 ppb.

As described above, compared to the comparative sample C1 and the comparative sample C2, the oscillator 1 has a superior characteristic that the variation in frequency (the frequency variation) in the stable operation is extremely small.

1.4. Frequency-Temperature Characteristic of Oscillator

Figure 11:
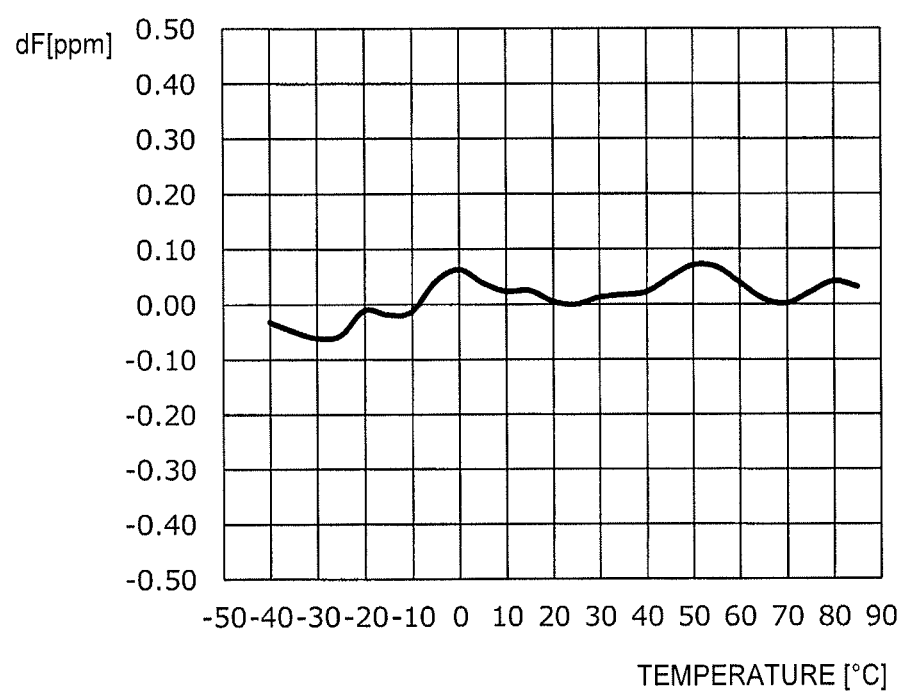
FIG. 11 is a graph showing a frequency-temperature characteristic of the oscillator according to the embodiment.

FIG. 11 is a graph showing the frequency-temperature characteristic of the oscillator 1. The graph shown in FIG. 11 is plotted with the frequency deviation (the deviation of the measured frequency from the desired frequency (the nominal frequency)) obtained when gradually varying the temperature from −40° C. to +85° C. with respect to the oscillator 1.

The configuration of the oscillator 1 used for the present evaluation is as explained in "1.3. Cold-Start Characteristic of Oscillator" described above.

As shown in FIG. 11, in the oscillator 1, the frequency deviation is within a range of ±0.3 ppm in the temperature range of no lower than −40° C. and no higher than +85° C.

1.5. Power Supply Voltage Variation Characteristic of Oscillator (CMOS Output)

Figures 12, 13:
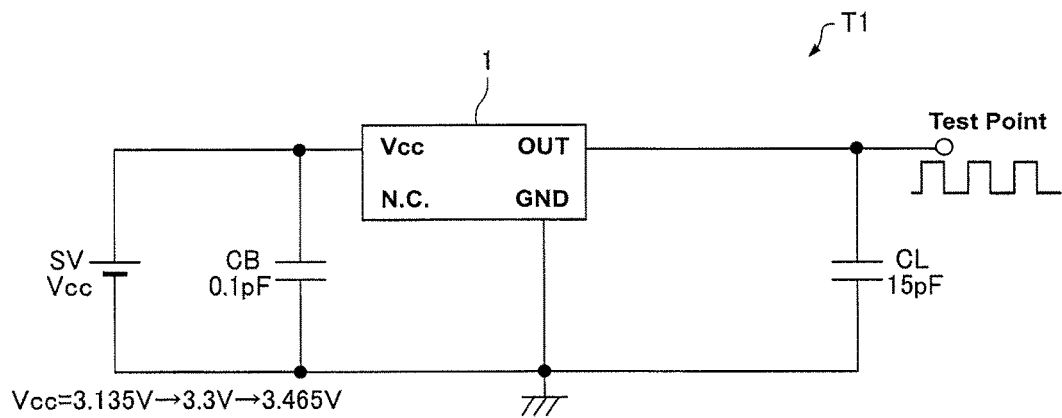
FIG. 12 is a circuit diagram showing a test circuit (a CMOS output type) for evaluating a power supply voltage variation characteristic of the oscillator according to the embodiment.
FIG. 13 is a table showing a result of the evaluation of the power supply voltage variation characteristic of the oscillator according to the embodiment.

FIG. 12 is a circuit diagram showing a test circuit (a CMOS output type) for evaluating a power supply voltage variation characteristic of the oscillator 1.

As shown in FIG. 12, the test circuit T1 includes the oscillator 1, a power supply SV, a bypass capacitor CB, and a load capacitance CL. The bypass capacitor CB has a capacitance of 0.1 pF, and the load capacitance CL is 15 pF. The configuration of the oscillator 1 used is as explained in "1.3. Cold-Start Characteristic of Oscillator" described above. It should be noted that the output frequency (the nominal frequency) of the oscillator 1 was set to 19.2 MHz.

The evaluation of the power supply voltage characteristic was performed by measuring the frequency of the oscillator 1 in the case of changing the power supply voltage Vcc to 3.135 V, 3.3 V, and 3.465 V in the test circuit T1, and then obtaining the frequency deviation (the deviation of the measured frequency from the desired frequency (the nominal frequency)) from the measured frequency. In other words, here, the power supply voltage Vcc was varied as much as ±5% from the reference voltage (Vcc=3.3 V). The measurement was performed in the state in which the oscillator 1 was kept constant at the reference temperature T0. The reference temperature T0 was set to 25° C.

FIG. 13 is a table showing an evaluation result of the power supply voltage variation characteristic (the CMOS output) of the oscillator 1. The table shown in FIG. 13 shows the result of the evaluation described above performed on the 10 samples (No. 1 through No. 10) of the oscillator 1 prepared in advance.

As shown in FIG. 13, the frequency deviations obtained when varying the power supply voltage Vcc as much as ±5% with respect to all of the samples No. 1 through No. 10 were within a range of ±0.1 ppm. As described above, the oscillator 1 has the characteristic that the power supply voltage variation characteristic (the CMOS output) obtained when varying the power supply voltage Vcc as much as ±5% is within a range of ±0.1 ppm.

1.6. Power Supply Voltage Variation Characteristic of Oscillator (Clipped Sine Output)

Figures 14, 15:
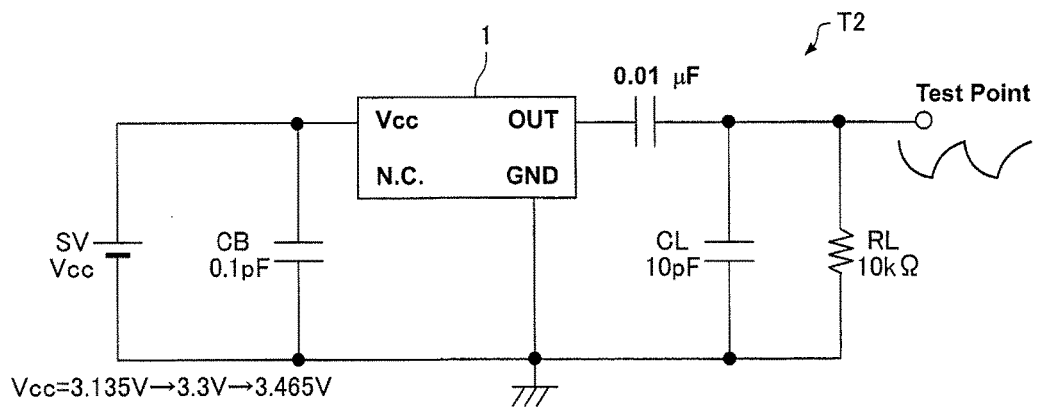
FIG. 14 is a circuit diagram showing a test circuit (a Clipped Sine output type) for evaluating a power supply voltage characteristic of the oscillator according to the embodiment.
FIG. 15 is a table showing a result of the evaluation of the power supply voltage variation characteristic of the oscillator according to the embodiment.

FIG. 14 is a circuit diagram showing a test circuit (a Clipped Sine output type) for evaluating a power supply voltage characteristic of the oscillator 1.

As shown in FIG. 14, the test circuit T2 includes the oscillator 1, a power supply SV, a bypass capacitor CB, a load capacitance CL, and a load resistance RL. The bypass capacitor CB has a capacitance of 0.1 pF, the load capacitance CL is 10 pF, and the load resistance RL is 10 kΩ. The configuration of the oscillator 1 used for the present evaluation is as explained in "1.3. Cold-Start Characteristic of Oscillator" described above. It should be noted that the output frequency (the nominal frequency) of the oscillator 1 was set to 19.2 MHz.

The evaluation of the power supply voltage variation characteristic was performed by measuring the frequency of the oscillator 1 in the case of changing the power supply voltage Vcc to 3.135 V, 3.3 V, and 3.465 V in the test circuit T2, and then obtaining the frequency deviation (the deviation of the measured frequency from the desired frequency (the nominal frequency)) from the measured frequency. In other words, here, the power supply voltage Vcc was varied as much as ±5% from the reference voltage (Vcc=3.3 V). The measurement was performed in the state in which the oscillator 1 was kept constant at the reference temperature T0. The reference temperature T0 was set to 25° C.

FIG. 15 is a table showing an evaluation result of the power supply voltage variation characteristic (the Clipped Sine output) of the oscillator 1. The table shown in FIG. 15 shows the result of the evaluation described above performed on the 10 samples (No. 1 through No. 10) of the oscillator 1 prepared in advance.

As shown in FIG. 15, the frequency deviations obtained when varying the power supply voltage Vcc as much as ±5% with respect to all of the samples No. 1 through No. 10 were within a range of ±0.1 ppm. As described above, the oscillator 1 has the characteristic that the power supply voltage variation characteristic (the Clipped Sine output) obtained when varying the power supply voltage Vcc as much as ±5% is within a range of ±0.1 ppm.

1.7. Load Variation Characteristic of Oscillator (CMOS Output)

Figures 16, 17:
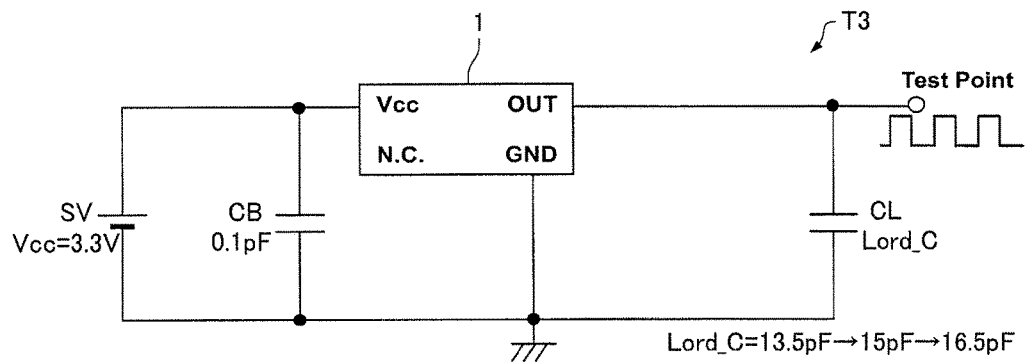
FIG. 16 is a circuit diagram showing a test circuit (a CMOS output type) for evaluating a load variation characteristic of the oscillator according to the embodiment.
FIG. 17 is a table showing a result of the evaluation of the load variation characteristic of the oscillator according to the embodiment.

FIG. 16 is a circuit diagram showing a test circuit (a CMOS output type) for evaluating a load variation characteristic of the oscillator 1.

As shown in FIG. 16, the test circuit T3 includes the oscillator 1, a power supply SV, a bypass capacitor CB, and a load capacitance CL. The power supply voltage Vcc is 3.3 V, and the bypass capacitor CB has a capacitance of 0.1 pF. The configuration of the oscillator 1 used for the present evaluation is as explained in "1.3. Cold-Start Characteristic of Oscillator" described above. It should be noted that the output frequency (the nominal frequency) of the oscillator 1 was set to 19.2 MHz.

The evaluation of the load variation characteristic was performed by measuring the frequency of the oscillator 1 in the case of changing the load capacitance CL to 13.5 pF, 15 pF, and 16.5 pF in the test circuit T3, and then obtaining the frequency deviation (the deviation of the measured frequency from the desired frequency (the nominal frequency)) from the measured frequency. In other words, here, the load capacitance CL was varied as much as ±10% from the reference load (Lord C=15 pF). The measurement was performed in the state in which the oscillator 1 was kept constant at the reference temperature T0. The reference temperature T0 was set to 25° C.

FIG. 17 is a table showing the load variation characteristic (the CMOS output) of the oscillator 1. The table shown in FIG. 17 shows the result of the evaluation described above performed on the 10 samples (No. 1 through No. 10) of the oscillator 1 prepared in advance.

As shown in FIG. 17, the frequency deviations obtained when varying the load capacitance CL as much as ±10% with respect to all of the samples No. 1 through No. 10 were within a range of ±0.1 ppm. As described above, the oscillator 1 has the characteristic that the load variation characteristic (the CMOS output) obtained when varying the load capacitance CL as much as ±10% is within a range of ±0.1 ppm.

1.8. Load Variation Characteristic of Oscillator (Clipped Sine Output)

Figures 18, 19:
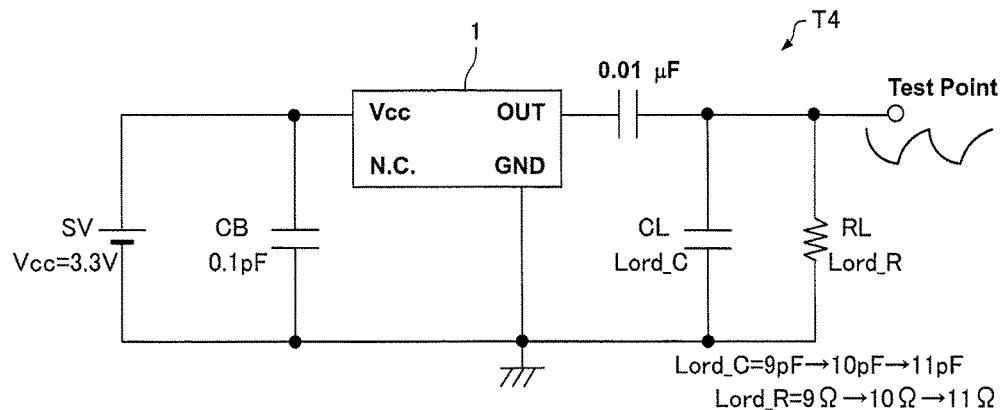
FIG. 18 is a circuit diagram showing a test circuit (a Clipped Sine output type) for evaluating a load variation characteristic of the oscillator according to the embodiment.
FIG. 19 is a table showing a result of the evaluation of the load variation characteristic of the oscillator according to the embodiment.

FIG. 18 is a circuit diagram showing a test circuit (a Clipped Sine output type) for evaluating a load variation characteristic of the oscillator 1.

As shown in FIG. 18, the test circuit T4 includes the oscillator 1, a power supply SV, a bypass capacitor CB, a load capacitance CL, and a load resistance RL. The power supply voltage Vcc is 3.3 V, and the bypass capacitor CB has a capacitance of 0.1 pF. The configuration of the oscillator 1 used for the present evaluation is as explained in "1.3. Cold-Start Characteristic of Oscillator" described above. It should be noted that the output frequency (the nominal frequency) of the oscillator 1 was set to 19.2 MHz.

The evaluation of the load variation characteristic was performed by measuring the frequency of the oscillator 1 in the case of changing the load resistance RL to 9Ω, 10Ω, and 11Ω while changing the load capacitance CL to 9 pF, 10 pF, and 11 pF in the test circuit T4, and then obtaining the frequency deviation (the deviation of the measured frequency from the desired frequency (the nominal frequency)) from the measured frequency. In other words, here, the load capacitance CL was varied as much as ±10% from the reference load (Lord C=10 pF), and at the same time, the load resistance RL was varied as much as ±10% from the reference load (Lord R=10Ω). The measurement was performed in the state in which the oscillator 1 was kept constant at the reference temperature T0. The reference temperature T0 was set to 25° C.

FIG. 19 is a table showing an evaluation result of the load variation characteristic (the Clipped Sine output) of the oscillator 1. The table shown in FIG. 19 shows the result of the evaluation described above performed on the 10 samples (No. 1 through No. 10) of the oscillator 1 prepared in advance.

As shown in FIG. 19, the frequency deviations obtained when varying the load capacitance CL and the load resistance as much as ±10% with respect to all of the samples No. 1 through No. 10 were within a range of ±0.1 ppm. As described above, the oscillator 1 has the characteristic that the load variation characteristic (the Clipped Sine output) obtained when varying the load capacitance CL and the load resistance as much as ±10% is within a range of ±0.1 ppm.

The oscillator 1 according to the present embodiment has, for example, the following features.

In the oscillator 1, the frequency deviation with respect to the frequency at the time point when the power supply starts is within a range of ±8 ppb at the time point when 10 seconds elapse from when the power supply starts, within a range of ±10 ppb at the time point when 20 seconds elapse from when the power supply starts, and within a range of ±10 ppb at the time point when 30 seconds elapse from when the power supply starts in the reference temperature state. As described above, the oscillator 1 has a superior cold-start characteristic compared to the related-art temperature-compensated crystal oscillator. Therefore, the oscillator 1 is also available for the electronic apparatus and the vehicle for which high frequency accuracy is required early after the start-up of the power supply. For example, by using the oscillator 1 for a communication system, an automated cruise system, and so on as described later, even in the case in which the system has been shut down, it is possible to promptly resume the communication with high communication quality.

Since in the oscillator 1, the oscillating circuit 10 and the temperature compensation circuit 40 are included in the integrated circuit (IC) 2, reduction in size of the device can be achieved.

The oscillator 1 includes the package 4 housing the resonator element 3 and the package 8 housing the resonator element 3 and the integrated circuit (IC) 2, and the integrated circuit (IC) 2 is bonded to the package 4, the space is disposed between the inner surface of the package 8 and the package 4, and the space is disposed between the inner surface of the package 8 and the integrated circuit (IC) 2. Thus, the heat generated in the integrated circuit (IC) 2 is conducted to the resonator element 3 in a short period of time, and thus the temperature difference between the integrated circuit (IC) 2 and the resonator element 3 is made small. As a result, the error in temperature compensation by the temperature compensation circuit 40 decreases, and thus, the superior cold-start characteristic described above can be realized.

In the oscillator 1, the package 4 has the base 4a and the lid 4b for sealing the base 4a and having the metallic material, and the integrated circuit (IC) 2 is bonded to the lid 4b. Since the material of the lid 4b to which the integrated circuit (IC) 2 is bonded is metal high in thermal conductivity, the heat generated in the integrated circuit (IC) 2 is conducted to the resonator element 3 in a short period of time to decrease the temperature difference between the integrated circuit (IC) 2 and the resonator element 3. As a result, the error in temperature compensation by the temperature compensation circuit 40 decreases, and thus, the superior cold-start characteristic described above can be realized.

In the oscillator 1, the frequency-temperature characteristic is within a range of ±0.3 ppm taking the nominal frequency as the reference value in the temperature range of no lower than −40° C. and no higher than +85° C. Further, in the oscillator 1, the power supply voltage variation characteristic in the case of varying the power supply voltage as much as ±5% is within a range of ±0.1 ppm taking the nominal frequency as the reference value. Further, in the oscillator 1, the load variation characteristic in the case of varying the load as much as ±10% is within a range of ±0.1 ppm taking the nominal frequency as the reference value. As described above, the oscillator 1 has the superior characteristic, and is therefore also available for the electronic apparatus and the vehicle for which high frequency accuracy is required.

1.9. Modified Examples of Oscillator

Then, some modified examples of the oscillator according to the present embodiment will be described.

1.9.1. First Modified Example

Figure 20:
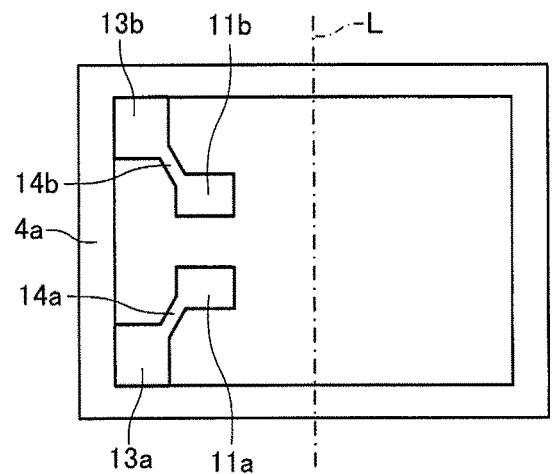
FIG. 20 is a plan view schematically showing a base of a package of an oscillator according to a first modified example.

FIG. 20 is a plan view schematically showing the base 4a of the package 4 of an oscillator according to a first modified example. FIG. 20 corresponds to FIG. 5.

As shown in FIG. 20, in the oscillator according to the first modified example, the arrangement of the electrode pads 11a, 11b, the electrode pads 13a, 13b, and the extraction interconnections 14a, 14b disposed on the base 4a is different from the arrangement shown in FIG. 5 described above.

As shown in FIG. 20, in a planar view (viewed from the normal direction of the bottom surface of the base 4a), when drawing an imaginary straight line L passing through the center of the base 4a to divide the base 4a into two equal parts, the electrode pad 13a and the electrode pad 13b are located in the part where the electrode pad 11a and the electrode pad 11b are disposed. Therefore, the difference in length between the extraction interconnection 14a and the extraction interconnection 14b can be made smaller compared to the arrangement shown in FIG. 5. In the example shown in the drawing, the length of the extraction interconnection 14a and the length of the extraction interconnection 14b are equal to each other.

In the oscillator according to the first modified example, when drawing the imaginary straight line L passing through the center of the base 4a to divide the base 4a into two equal parts in the planar view, the electrode pad 13a and the electrode pad 13b are located in the part where the electrode pad 11a and the electrode pad 11b are disposed. Therefore, it is possible to decrease the difference between the length of the extraction interconnection 14a and the length of the extraction interconnection 14b. Thus, it is possible to decrease the difference between the path length of the path through which the heat from the outside of the package 4 is transferred to the resonator element 3 via the electrode pad 13a, the extraction interconnection 14a and the electrode pad 11a, and the path length of the path through which the heat is transferred to the resonator element 3 via the electrode pad 13b, the extraction interconnection 14b and the electrode pad 11b.

As a result, compared to the example of the oscillator 1 shown in FIG. 5 described above, for example, the temperature variation of the resonator element 3 can be reduced, and thus, the temperature difference between the integrated circuit (IC) 2 and the resonator element 3 can be decreased. Therefore, according to the first modified example, it is possible to realize the oscillator having the cold-start characteristic superior to the cold start characteristic of the oscillator 1 shown in FIG. 8 described above.

1.9.2. Second Modified Example

Although in the embodiment described above, the space of the package 4 for housing the resonator element 3 and the space of the package 8 for housing the integrated circuit (IC) 2 and the package 4 are provided with the nitrogen gas atmosphere, it is also possible to provide these spaces with a helium gas atmosphere. Since the helium gas is higher in thermal conductivity compared to the nitrogen gas, the temperature difference between the integrated circuit (IC) 2 and the resonator element 3 can be decreased. As a result, according to the present modified example, it is possible to realize the oscillator having the cold-start characteristic superior to the cold start characteristic of the oscillator 1 shown in FIG. 8 described above.

Further, it is also possible to arrange that the space of the package 4 for housing the resonator element 3 is provided with the inert gas atmosphere with the nitrogen gas, the helium gas, or the like, and the space of the package 8 for housing the integrated circuit (IC) 2 and the package 4 is in the vacuum state (the state in which the pressure is lower than the atmospheric pressure). Thus, it is possible to reduce the influence of the temperature variation outside the package 8 on the integrated circuit (IC) 2 and the resonator element 3 while decreasing the temperature difference between the integrated circuit (IC) 2 and the resonator element 3. As a result, according to the present modified example, it is possible to realize the oscillator having the cold-start characteristic superior to the cold start characteristic of the oscillator 1 shown in FIG. 8 described above.

2. Electronic Apparatus

Figure 21:
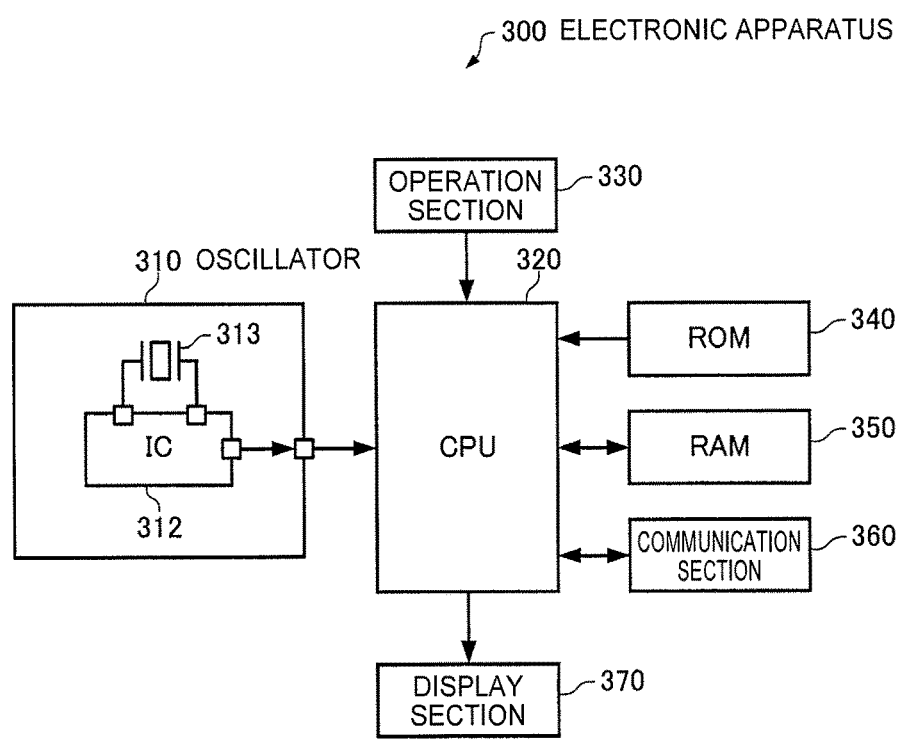
FIG. 21 is a functional block diagram showing an example of a configuration of an electronic apparatus according to the embodiment.
Figure 22:
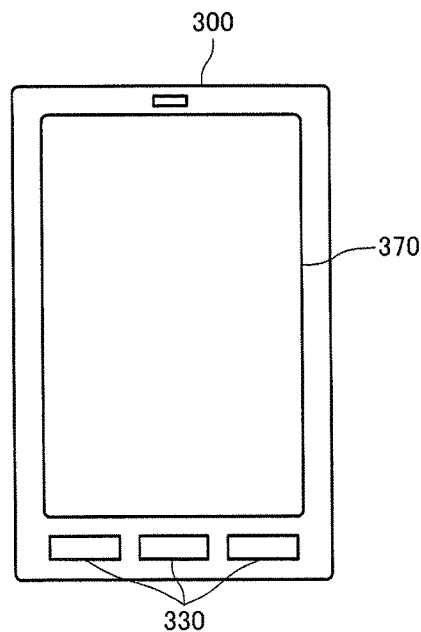
FIG. 22 is a diagram showing an example of an external view of the electronic apparatus according to the embodiment.

FIG. 21 is a functional block diagram showing an example of a configuration of an electronic apparatus according to the present embodiment. Further, FIG. 22 is a diagram showing an example of the appearance of a smartphone as an example of the electronic apparatus according to the present embodiment.

The electronic apparatus 300 according to the present embodiment is configured including an oscillator 310, a central processing unit (CPU) 320, an operation section 330, a read only memory (ROM) 340, a random access memory (RAM) 350, a communication section 360, and a display section 370. It should be noted that the electronic apparatus according to the present embodiment can be provided with a configuration obtained by eliminating or modifying some of the constituents (sections) shown in FIG. 21, or adding other constituents thereto.

The oscillator 310 is provided with an integrated circuit (IC) 312 and a resonator 313. The integrated circuit (IC) 312 oscillates the resonator 313 to generate an oscillation signal. The oscillation signal is output from an external terminal of the oscillator 310 to the CPU 320.

The CPU 320 performs a variety of types of arithmetic processing and control processing using the oscillation signal input from the oscillator 310 as a clock signal in accordance with the program stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, and so on.

The operation section 330 is an input device constituted by operation keys, button switches, and so on, and outputs the operation signal corresponding to the operation by the user to the CPU 320.

The ROM 340 stores the programs, data, and so on for the CPU 320 to perform the variety of types of arithmetic processing and control processing.

The RAM 350 is used as a working area of the CPU 320, and temporarily stores, for example, the programs and the data retrieved from the ROM 340, the data input from the operation section 330, and the calculation result obtained by the CPU 320 performing operations in accordance with the variety of types of programs.

The communication section 360 performs a variety of types of control for achieving the data communication between the CPU 320 and the external devices.

The display section 370 is a display device formed of a liquid crystal display (LCD) or the like, and displays a variety of types of information based on the display signal input from the CPU 320. The display section 370 can also be provided with a touch panel, which functions as the operation section 330.

By applying, for example, the oscillator 1 described above as the oscillator 310, it is possible to realize the electronic apparatus equipped with the oscillator having an excellent cold-start characteristic.

As such an electronic apparatus 300, a variety of electronic apparatuses can be adopted, and there can be cited, for example, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router ora switch, a local area network apparatus, an apparatus for a mobile terminal base station, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

As an example of the electronic apparatus 300 according to the present embodiment, there can be cited a transmission device using the oscillator 310 described above as a reference signal source, a voltage-controlled oscillator (VCO), or the like, and functioning as, for example, a terminal base station device for performing communication with terminals wirelessly or with wire. By applying the oscillator 1 as the oscillator 310, it is possible to realize the electronic apparatus, for which the high performance and the high reliability are required, and which is available for, for example, the communication base station.

Further, as another example of the electronic apparatus 300 according to the present embodiment, it is possible to adopt a communication device in which the communication section 360 receives an external clock signal, and the CPU 320 (the processing section) includes a frequency control section for controlling the frequency of the oscillator 310 based on the external clock signal and the output signal (an internal clock signal) of the oscillator 310. The communication device can be a communication apparatus used for, for example, a backbone network apparatus such as Stratum-3, or a femtocell.

3. Vehicle

Figure 23:
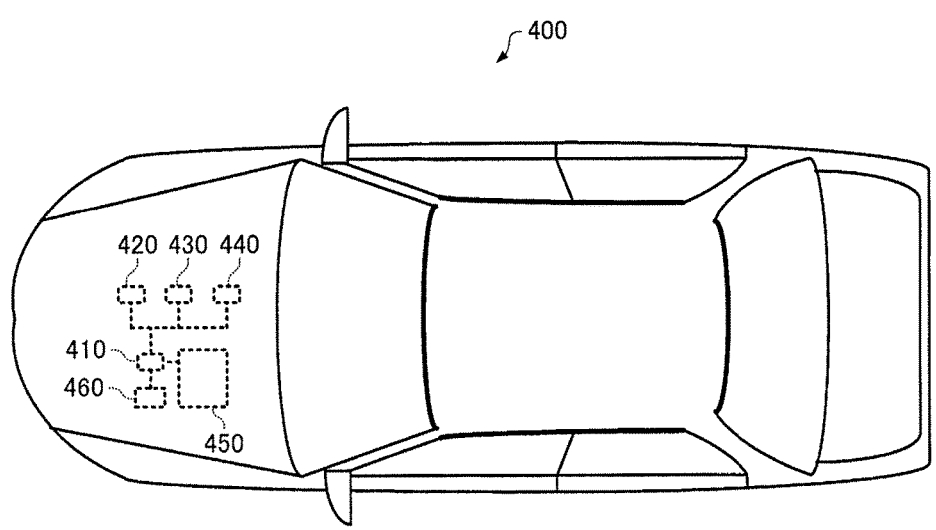
FIG. 23 is a diagram showing an example of a vehicle according to the embodiment.
Figure 24:
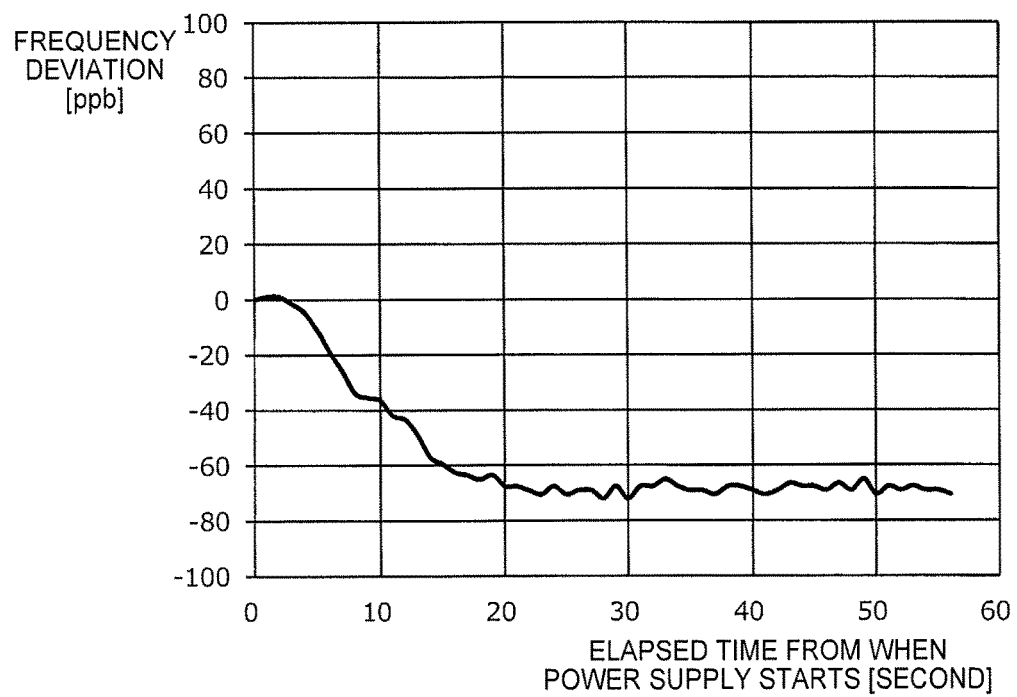
FIG. 24 is a graph showing an example of a cold-start characteristic of a related-art oscillator.

FIG. 23 is a diagram (a top view) showing an example of a vehicle according to the present embodiment. The vehicle 400 shown in FIG. 23 is configured including an oscillator 410, controllers 420, 430, and 440 for performing a variety of types of control such as an engine system, a brake system, and a keyless entry system, a battery 450, and a backup battery 460. It should be noted that the vehicle according to the present embodiment can have a configuration obtained by eliminating some of the constituents (sections) shown in FIG. 23, or adding other constituents thereto.

The oscillator 410 is provided with an integrated circuit (IC) and a resonator element not shown, and the integrated circuit (IC) oscillates the resonator element to generate the oscillation signal. The oscillation signal is output from the external terminal of the oscillator 410 to the controllers 420, 430, and 440, and is used as, for example, a clock signal.

The battery 450 supplies the oscillator 410 and the controllers 420, 430, and 440 with electrical power. The backup battery 460 supplies the oscillator 410 and the controllers 420, 430, and 440 with the electrical power when the output voltage of the battery 450 drops to a level lower than a threshold value.

By applying, for example, the oscillator 1 described above as the oscillator 410, it is possible to realize the vehicle equipped with the oscillator having an excellent cold-start characteristic.

As such a vehicle 400, there can be adopted a variety of types of vehicles, and there can be cited a car (including an electric car), an aircraft such as a jet plane ora helicopter, a ship, a boat, a rocket, an artificial satellite, and so on.

The invention is not limited to the embodiment, but can be implemented with a variety of modifications within the scope or the spirit of the invention.

The embodiment and the modified examples described above are illustrative only, and the invention is not limited to the embodiment and the modified examples. For example, it is also possible to arbitrarily combine any of the embodiment and the modified examples described above with each other.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations providing the same functions and advantages and configurations capable of achieving the same object as the configuration described as the embodiment of the invention. Further, the invention includes configurations obtained by adding known technologies to the configuration described as one of the embodiments of the invention.

The entire disclosure of Japanese Patent Application No. 2016-055871, filed Mar. 18, 2016 is expressly incorporated by reference herein.

What is claimed is:

1. A temperature-compensated oscillator comprising:
a resonator element;
an IC chip provided with an oscillating circuit and a temperature compensation circuit;
a first container housing the resonator element;
a second container housing the first container and the IC chip, the IC chip being bonded to the first container; and
a hollow space being disposed between an inner surface of the second container and the IC chip, wherein:
a frequency deviation with respect to a frequency at a time point when power supply starts is
within a range of ±8 ppb at a time point when 10 seconds elapse from when the power supply starts,
within a range of ±10 ppb at a time point when 20 seconds elapse from when the power supply starts, and
within a range of ±10 ppb at a time point when 30 seconds elapse from when the power supply starts.

2. The oscillator according to claim 1, wherein a frequency-temperature characteristic is within a range of ±0.3 ppm taking a nominal frequency as a reference value in a temperature range of no lower than −40° C. and no higher than +85° C.

3. The oscillator according to claim 2, wherein a power supply voltage variation characteristic in a case of varying a power supply voltage as much as ±5% is within a range of ±0.1 ppm taking a nominal frequency as a reference value.

4. The oscillator according to claim 3, wherein a load variation characteristic in a case of varying a load as much as ±10% is within a range of ±0.1 ppm taking a nominal frequency as a reference value.

5. The oscillator according to claim 2, wherein a load variation characteristic in a case of varying a load as much as ±10% is within a range of ±0.1 ppm taking a nominal frequency as a reference value.

6. The oscillator according to claim 2, wherein:
the first container includes
a base, and
a lid adapted to seal the base and made of metal; and
the IC chip is bonded to the lid.

7. The oscillator according to claim 1, wherein a power supply voltage variation characteristic in a case of varying a power supply voltage as much as ±5% is within a range of ±0.1 ppm taking a nominal frequency as a reference value.

8. The oscillator according to claim 7, wherein a load variation characteristic in a case of varying a load as much as ±10% is within a range of ±0.1 ppm taking a nominal frequency as a reference value.

9. The oscillator according to claim 7, wherein:
the first container includes
a base, and
a lid adapted to seal the base and made of metal; and
the IC chip is bonded to the lid.

10. The oscillator according to claim 1, wherein a load variation characteristic in a case of varying a load as much as ±10% is within a range of ±0.1 ppm taking a nominal frequency as a reference value.

11. The oscillator according to claim 1, wherein:
the first container includes
a base, and
a lid adapted to seal the base and made of metal; and
the IC chip is bonded to the lid.

12. An electronic apparatus comprising:
the oscillator according to claim 1.

13. A vehicle comprising:
the oscillator according to claim 1.

14. The oscillator according to claim 1, wherein the first container is mounted to an inner base of the second container.

15. The oscillator according to claim 1, wherein a hollow space is disposed between at least a portion of the inner surface of the second container and the first container.

* * * * *